United States Patent [19]

Maciolek et al.

[11] 3,884,788

[45] May 20, 1975

[54] SUBSTRATE PREPARATION FOR LIQUID PHASE EPITAXY OF MERCURY CADMIUM TELLURIDE

[75] Inventors: Ralph B. Maciolek, Hennepin; Richard A. Skogman, Dakota; Charles J. Speerschneider, Hennepin, all of Minn.

[73] Assignee: Honeywell, Inc., Minneapolis, Minn.

[22] Filed: Aug. 30, 1973

[21] Appl. No.: 393,265

[52] U.S. Cl. ................. 204/192; 117/213; 117/215

[51] Int. Cl. ....... C23c 15/00; B44d 1/14; B44d 1/18

[58] Field of Search ............ 117/106 R, 106 A, 215, 117/201, 213; 204/192; 148/171, 172, 175

[56] References Cited

UNITED STATES PATENTS

| | | | |
|---|---|---|---|
| 3,385,731 | 5/1968 | Weimer | 204/192 |
| 3,496,024 | 2/1970 | Ruehrwein | 136/89 |
| 3,531,335 | 9/1970 | Heyerdahl et al. | 148/174 |
| 3,619,282 | 11/1971 | Manley et al. | 117/106 A |
| 3,619,283 | 11/1971 | Carpenter et al. | 117/201 |
| 3,642,529 | 2/1972 | Lee et al. | 117/106 R |
| 3,664,866 | 5/1972 | Manasevit | 117/201 |
| 3,748,246 | 7/1973 | Goell | 204/192 |
| 3,779,803 | 12/1973 | Lee et al. | 117/106 R |
| 3,802,967 | 4/1974 | Ladany et al. | 117/201 |
| 3,809,584 | 5/1974 | Akai et al. | 117/201 |

*Primary Examiner*—Cameron K. Weiffenbach
*Attorney, Agent, or Firm*—David R. Fairbairn

[57] ABSTRACT

Substrates suitable for epitaxial growth of mercury cadmium telluride are formed by cleaning a surface of the substrate and then depositing a thin layer of cadmium telluride on the cleaned surface.

3 Claims, No Drawings

SUBSTRATE PREPARATION FOR LIQUID PHASE EPITAXY OF MERCURY CADMIUM TELLURIDE

REFERENCE TO CO-PENDING APPLICATION

The invention herein described was made in part under a contract with the Department of the Army.

Reference should be made to a co-pending application Ser. No. 393,264 by R. B. Maciolek and C. J. Speerschneider entitled "Growth of Mercury Cadmium Telluride by Liquid Phase Epitaxy" which was filed on even date, Aug. 30, 1973, herewith and which is assigned to the same assignee as the present application. In this co-pending application, the growth of mercury cadmium telluride by liquid phase epitaxy is described.

BACKGROUND OF THE INVENTION

Liquid phase epitaxy of mercury cadmium telluride has several advantages. First, the mercury cadmium telluride layers are grown on an insulating substrate. Many of the post growth processing steps required to make detectors from bulk grown mercury cadmium telluride are thus avoided. The liquid phase epitaxial films are particularly advantageous for fabrication of detector arrays. Second, since layers of mercury cadmium telluride grown by liquid phase epitaxy are grown directly on the substrate, the epoxy layer used in present mercury cadmium telluride detectors is eliminated. Third, mercury cadmium telluride layers grown by liquid phase epitaxy are grown at lower temperatures than directly solidified bulk mercury cadmium telluride of the same $x$ value. Liquid phase epitaxy thus presents a means of reducing stoichiometric and foreign impurity defects in mercury cadmium telluride.

It was discovered that one of the most important growth parameters in liquid phase epitaxial growth of mercury cadmium telluride is the substrate. The selection of a substrate material is based on the matching of a number of properties of the substrate and the epitaxial film. These include crystal structure, lattice spacing, and coefficient of thermal expansion. In addition, the substrate material and the epitaxial material should be chemically compatible over the temperature range of interest. In other words, the substrate and the epitaxial layer preferably should not react other than to form a bond between them.

Several substrate materials were investigated for liquid phase epitaxial growth of mercury cadmium telluride. The materials included cadmium telluride, silicon, spinel ($MgAl_2O_4$), and sapphire ($Al_2O_3$).

Cadmium telluride was found to have several advantages as a substrate for mercury cadmium telluride liquid phase epitaxial growth. First, cadmium telluride is composed of two of the three atomic species of mercury cadmium telluride. Second, cadmium telluride is an insulating material and thus forms a high resistivity substrate. Third, the structure of cadmium telluride is identical to the structure of mercury cadmium telluride and the lattice spacing of cadmium telluride closely matches that of mercury cadmium telluride. Mercury cadmium telluride layers grown on cadmium telluride by liquid phase epitaxy exhibit excellent adherence to the substrate and are true epitaxial layers. In other words, the structure of the cadmium telluride substrate and the as-grown mercury cadmium telluride layer is the same and continuous across the interface.

There is an important disadvantage, however, to the use of cadmium telluride as the substrate material. Cadmium telluride interacts with mercury cadmium telluride during liquid phase epitaxial growth. Experimental results show that the dissolution of the cadmium telluride substrate is substantial. In one sample, the substrate showed a 10.4% decrease in thickness as a result of dissolution during the growth process. In fact, the final thickness of the substrate plus the mercury cadmium telluride layer was less than the original cadmium telluride substrate thickness. This interaction of cadmium telluride and mercury cadmium telluride during growth results in a compositional gradient near the interface of the substrate and the as-grown layer.

In some applications, the compositional gradient present when mercury cadmium telluride is grown on cadmium telluride substrates is undesirable. For that reason, other substrate materials have been examined. Liquid phase epitaxial growth of mercury cadmium telluride on substrates other than cadmium telluride has proved to be quite difficult. In liquid phase epitaxial growth of mercury cadmium telluride on silicon substrates, it was found that as-grown layers adhered poorly to the substrate. The poor adherence or bonding behavior was believed to be caused by the oxide layer that forms on silicon. This oxide layer is difficult to remove and forms spontaneously at room temperature when silicon is exposed to air. As a result, all epitaxial processes for silicon must be designed to remove this oxide in the growth ampoule so that the epitaxial growth layers can be deposited on an oxide-free surface. In the semiconductor industry, high temperature gaseous reactions are used to remove the oxide and grow epitaxial layers in the same process step. This type of procedure, however, is not feasible in liquid phase epitaxial growth of mercury cadmium telluride.

Spinel ($MgAl_2O_4$) does not have an oxide layer of the type which forms on silicon. Attempts to grow mercury cadmium telluride layers directly on spinel substrates, however, were not successful.

SUMMARY OF THE INVENTION

In the present invention, it has been discovered that the preparation of the substrate surface is just as critical as the selection of the proper substrate material to the development of a proper bond between the substrate and the mercury cadmium telluride epitaxial film. A substrate surface preparation which yields a substrate suitable for epitaxial growth of mercury cadmium telluride has been developed. This method comprises cleaning a surface of the substrate, and depositing a thin layer of cadmium telluride on the surface.

DESCRIPTION OF THE PREFERRED EMBODIMENTS

In the present invention, a substrate suitable for epitaxial growth of mercury cadmium telluride is prepared by cleaning a surface of the substrate material and then depositing a thin layer of cadmium telluride on the cleaned surface. The cadmium telluride layer is preferably about 500 A to 1,000 A thick.

The purpose of the cleaning step is to provide a clean substrate surface for epitaxial growth. In the case of silicon, the cleaning removes the oxide layer which forms on silicon. In the case of other substrate materials such as spinel, sapphire, and quartz, the purpose of the cleaning step is to remove any surface dirt or impurities which may inhibit epitaxial growth. The cleaning may be achieved, for example, by ion bombardment, electron bombardment, chemical etching, or sputter etching techniques. Since a layer of cadmium telluride must be deposited after cleaning, sputter etching is the preferred cleaning technique.

The purpose of the cadmium telluride layer is twofold. First, the cadmium telluride layer protects the clean surface obtained by etching. Second, the cadmium telluride promotes bonding between the substrate and the mercury cadmium telluride layer.

Although the deposition of cadmium telluride may be achieved by a variety of techniques such as chemical vapor deposition or evaporative deposition, sputter deposition has a particular advantage for the present invention. By sputtering, some cadmium telluride can be driven into the substrate crystal lattice. This penetration of the cadmium telluride into the lattice is enhanced by proper sputtering conditions. Thus the substrate has both a clean surface and a slight compositional gradient to promote bonding between the substrate and the as-grown mercury cadmium telluride layer.

During liquid phase epitaxial growth, the cadmium telluride on the surface of the substrate is dissolved in the mercury cadmium telluride melt. Since the cadmium telluride layer is only about 500 A to 1,000 A thick, the amount of cadmium telluride introduced into the melt does not significantly alter the initial melt composition.

Silicon substrates were prepared according to the present invention. A (110) oriented silicon substrate was sputter etched to remove the oxide layer. While the silicon substrate was still in the sputtering apparatus, a layer of cadmium telluride of about 500 A to about 1,000 A was deposited on the oxide-free surface. The cadmium telluride coated substrate was then removed from the sputtering apparatus and used as a substrate for liquid phase epitaxial growth of mercury cadmium telluride. The cadmium telluride coated silicon substrate was brought in contact with a mercury cadmium telluride melt at a growth temperature of about 700°C. An epitaxial film was formed which showed good bonding between the as-grown layer and the silicon substrate. This was quite different from prior attempts to grow mercury cadmium telluride directly on silicon substrates. In these prior attempts, the mercury cadmium telluride adhered poorly to the silicon substrate. Cracks were observed at the mercury cadmium telluride silicon interface.

Although the surface preparation technique of the present invention was successful in promoting bonding between the as-grown layer and the silicon substrate, the growth technique was not altogether successful. The silicon reacted with the mercury cadmium telluride melt resulting in a partial dissolution of the substrate as well as formation of a two phase epitaxial film. Consequently, cadmium telluride coated silicon substrates are not applicable for liquid phase epitaxial growth of mercury cadmium telluride at temperatures of about 700°C. They may be applicable, however, for liquid phase epitaxial growth of mercury cadmium telluride at lower temperatures.

The substrate preparation technique of the present invention was also applied to spinel substrates. Attempts to grow mercury cadmium telluride on spinel substrates directly were not successful. When the spinel was first etched and a 500 A to 1,000 A layer of cadmium telluride was then sputter deposited on the clean surface, growth of a mercury cadmium telluride layer was successful. Metallographic analysis using scanning electron microscope techniques showed an excellent bond at the interface between the spinel substrate and the mercury cadmium telluride film.

The method of the present invention was also used to prepare sapphire substrates for mercury cadmium telluride liquid phase epitaxial growth. Liquid phase epitaxial growth of mercury cadmium telluride on cadmium telluride coated sapphire substrates was achieved.

In one liquid phase epitaxial growth, the mercury cadmium telluride melt came in contact not only with a cadmium telluride coated sapphire surface, but also with a surface of the sapphire substrate which had not been etched or coated with cadmium telluride. Mercury cadmium telluride was deposited on both surfaces. Microscopic observation of the mercury cadmium telluride layer on the prepared surface showed an excellent bond. Microscopic observation of the interface of the mercury cadmium telluride with the unprepared surface revealed a substantial crack. In other words, mercury cadmium telluride exhibited excellent adherence to the prepared surface, but poor adherence to the unprepared surface.

In the case of spinel and sapphire, there was no reaction between the mercury cadmium telluride melt and the spinel or sapphire. This makes spinel and sapphire highly advantageous substrate materials for liquid phase epitaxial growth of mercury cadmium telluride.

Other materials which do not chemically react with mercury cadmium telluride may also be used. For example, quartz is a particularly advantageous substrate material because it (1) is readily available, (2) is inexpensive, and (3) is wetted by cadmium telluride and mercury cadmium telluride. The wetting property allows the growth of a mercury cadmium telluride layer of uniform thickness, which is advantageous for subsequent device fabrication. In fused quartz, the thermal coefficient of expansion is much less than that of mercury cadmium telluride. This may make fused quartz less desirable as a substrate material. Crystalline quartz, on the other hand, has a thermal coefficient of expansion which is much closer to that of mercury cadmium telluride. Crystalline quartz, therefore, is a promising substrate material.

The substrate preparation technique of the present invention may be further explained by the following example. It will be understood by skilled workers in the art, however, that the present invention is not limited to the specific parameters described.

The initial step in substrate preparation consisted of slicing and cutting the substrate material into a circular disc of the desired diameter and thickness. In one preferred embodiment, the diameter was about 0.300 inch and the thickness was about 0.065 inch. A diamond saw was used to slice the bulk substrate materials to the desired thickness. The slices of material were then cemented to a base plate and circular discs were cut either using a rotary cutter or an ultrasonic grinder. In each case, number 600 grinding or cutting compound was used. The ultrasonic grinder was required for hard substrate materials such as silicon, spinel, and sapphire.

The substrate was then mechanically polished to obtain plane and parallel surfaces. The substrate was then ready for the etching and deposition of cadmium telluride. A sputtering apparatus was used for both etching and deposition. The substrate was placed on the substrate electrode of the sputter system and the system was evacuated to $10^{-7}$ torr. With a shutter in place between the substrate and the target electrode, the substrate was sputter etched for approximately 5 minutes at relatively low sputter pressure (7 microns) in argon with 200 watts of power to the substrate electrode. This step removed any oxide on the surface of the substrate and cleaned the substrate surface.

In the next step, the sputter power was shifted to the target electrode (cadmium telluride), and the shutter was removed to sputter cadmium telluride from the target to the substrate. Sputtering conditions were sputter pressure of 7 microns, argon; power of 200 watts; and time of 5 minutes. These conditions can be adjusted to deposit a layer of the proper thickness and to promote penetration and diffusion of the cadmium telluride into the substrate lattice.

Finally, the cadmium telluride coated substrate was removed from the sputter apparatus and mounted in the liquid phase epitaxial growth apparatus. The substrate was brought in contact with a melt of mercury, cadmium, and tellurium. Supersaturation and growth of a layer of mercury cadmium telluride on the surface of the substrate was produced.

In conclusion, it has been found that preparation of the substrate surface is very important to the development of a proper bond between a substrate and a mercury cadmium telluride epitaxial layer. According to the present invention, surface preparation of the substrate to achieve the desired bonding is accomplished by a technique having relatively few steps. The present invention has been disclosed with reference to a series of preferred embodiments and specific examples. Changes in form and detail, however, may be made without departing from the spirit and scope of the invention.

The embodiments of the invention in which an exclusive property or right is claimed are defined as follows:

1. A method of depositing a layer of mercury cadmium from a liquid solution on to a substrate which does not substantially chemically react with the liquid solution, the method comprising:

sputter etching a surface of the substrate;

sputter depositing a thin layer of cadmium telluride on the surface; and epitaxially depositing a layer of mercury cadmium telluride by contacting the cadmium telluride coated surface with a liquid solution of mercury, cadmium and tellurium.

2. The method of claim 1 wherein sputter depositing also results in penetration of a portion of the cadmium telluride into the substrate.

3. The method of claim 1 wherein the thin layer of cadmium telluride has a thickness of between about 500A and about 1000A.

* * * * *